United States Patent
Chiu et al.

(10) Patent No.: US 8,604,578 B2
(45) Date of Patent: *Dec. 10, 2013

(54) CHIP PACKAGE

(76) Inventors: Hsin-Chih Chiu, New Taipei (TW);
Chia-Ming Cheng, Taipei (TW);
Chuan-Jin Shiu, Zhongli (TW);
Bai-Yao Lou, Hsinchu (TW)

(*) Notice: Subject to any disclaimer, the term of this patent is extended or adjusted under 35 U.S.C. 154(b) by 42 days.

This patent is subject to a terminal disclaimer.

(21) Appl. No.: 13/279,183

(22) Filed: Oct. 21, 2011

(65) Prior Publication Data

US 2012/0097999 A1    Apr. 26, 2012

Related U.S. Application Data

(60) Provisional application No. 61/046,481, filed on Oct. 25, 2010.

(51) Int. Cl.
*H01L 31/0203* (2006.01)

(52) U.S. Cl.
USPC ............ 257/433; 257/E33.057; 257/E31.122

(58) Field of Classification Search
USPC ............ 257/91, 435, E31.124, E33.066, 433, 257/E33.059, E31.122, E33.057, E21.508; 438/613

See application file for complete search history.

(56) References Cited

U.S. PATENT DOCUMENTS

| | | | |
|---|---|---|---|
| 6,630,736 B1* | 10/2003 | Ignaut | 257/737 |
| 2005/0161805 A1* | 7/2005 | Ono et al. | 257/704 |
| 2009/0096051 A1* | 4/2009 | Sugiyama et al. | 257/435 |
| 2011/0186987 A1* | 8/2011 | Wang et al. | 257/737 |

* cited by examiner

*Primary Examiner* — Daniel Luke
*Assistant Examiner* — Khaja Ahmad
(74) *Attorney, Agent, or Firm* — Liu & Liu

(57) ABSTRACT

An embodiment of the invention provides a chip package which includes: a substrate having a first surface and a second surface; an optoelectronic device disposed at the first surface; a protection layer located on the second surface of the substrate, wherein the protection layer has an opening; a light shielding layer located on the second surface of the substrate, wherein a portion of the light shielding layer extends into the opening of the protection layer; a conducting bump disposed on the second surface of the substrate and filled in the opening of the protection layer; and a conducting layer located between the substrate and the protection layer, wherein the conducting layer electrically connects the optoelectronic device to the conducting bump.

19 Claims, 4 Drawing Sheets

CHIP PACKAGE

CROSS REFERENCE TO RELATED APPLICATIONS

This application claims the benefit of U.S. Provisional Application No. 61/406,481, filed on Oct. 25, 2010, the entirety of which is incorporated by reference herein.

BACKGROUND OF THE INVENTION

1. Field of the Invention

The present invention relates to a chip package, and in particular relates to an optoelectronic device chip package.

2. Description of the Related Art

Optoelectronic devices such as light sensing devices or light emitting devices play important roles in image capture or illumination applications. The optoelectronic devices have been widely used in the applications of, for example, digital cameras, digital video recorders, mobile phones, solar cells, monitors, or lighting equipments.

Along with advancements in technological development, requirements for light sensing precision of light sensing devices or light emitting precision of light emitting devices have accordingly been increased.

BRIEF SUMMARY OF THE INVENTION

An embodiment of the invention provides a chip package which includes: a substrate having a first surface and a second surface; an optoelectronic device disposed at the first surface; a protection layer located on the second surface of the substrate, wherein the protection layer has an opening; a light shielding layer located on the second surface of the substrate, wherein a portion of the light shielding layer extends into the opening of the protection layer; a conducting bump disposed on the second surface of the substrate and filled in the opening of the protection layer; and a conducting layer located between the substrate and the protection layer, wherein the conducting layer electrically connects the optoelectronic device to the conducting bump.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a light sensing device or a light emitting device. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power MOSFET modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

Figure 1A:
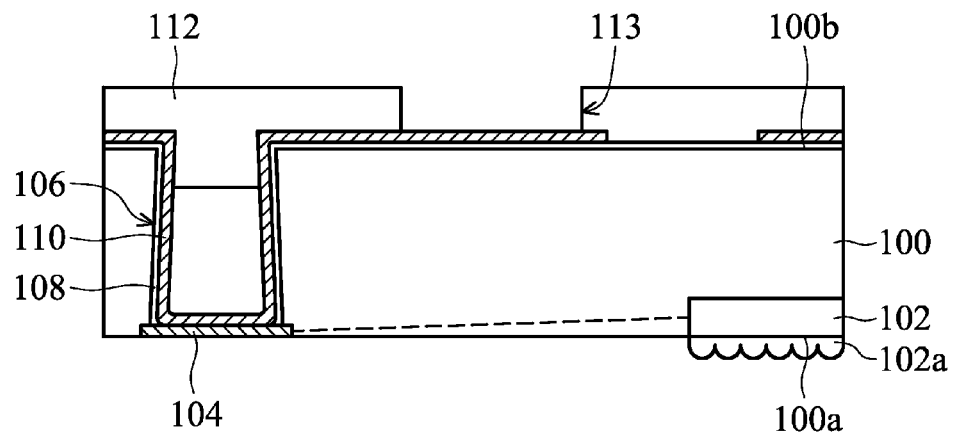
FIGS. 1A-1C are cross-sectional views showing the steps of forming a chip package according to an embodiment of the present invention.
Figure 1B:
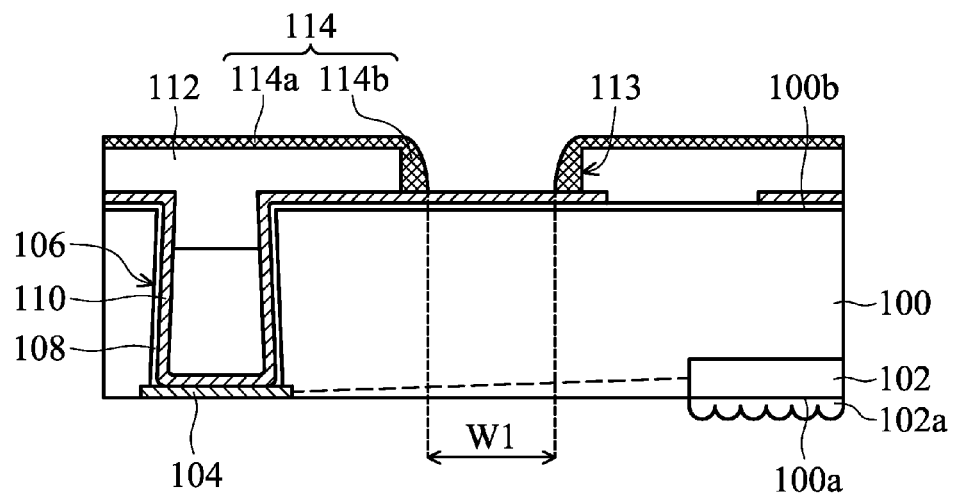
Figure 1C:
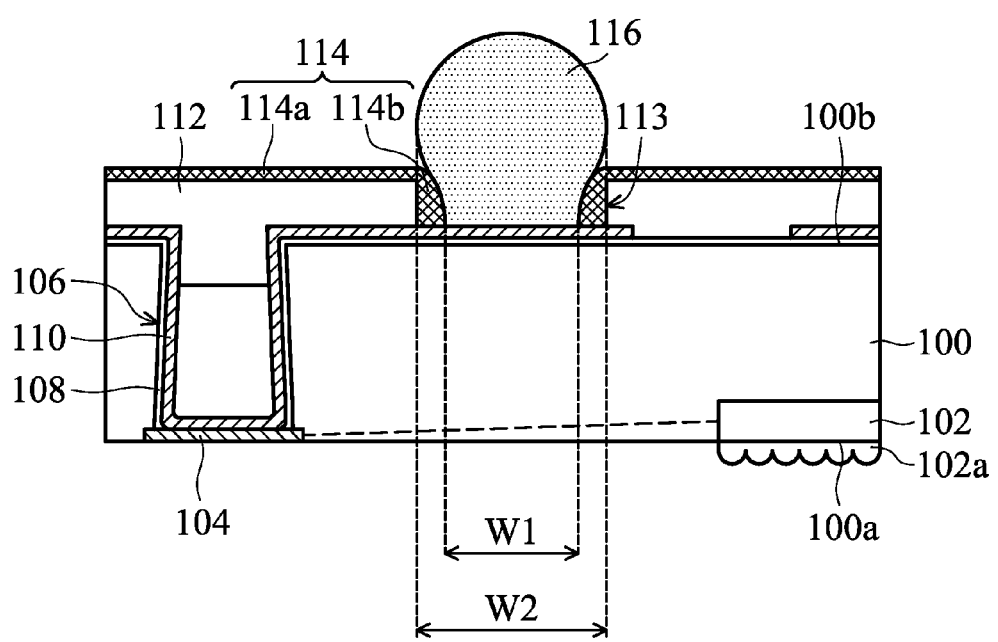

FIGS. 1A-1C are cross-sectional views showing the steps of forming a chip package according to an embodiment of the present invention. As shown in FIG. 1A, a substrate 100 is provided, which is, for example, a semiconductor substrate or a ceramic substrate. In one embodiment, the substrate 100 includes a semiconductor material, which is, for example, a semiconductor wafer (such as a silicon wafer) and a wafer-level packaging process may be performed to reduce fabrication time and fabrication cost. The substrate 100 has a surface 100a and a surface 100b. For example, the surface 100a and the surface 100b may be opposite to each other.

As shown in FIG. 1A, in one embodiment, an optoelectronic device 102 is disposed at the surface 100a. The optoelectronic device 102 may include (but is not limited to) an image sensor device or a light emitting device. The image sensor device is, for example, a CMOS image sensor device (CIS) or a charge-coupled device (CCD), and the light emitting device is, for example, a light emitting diode device. For example, the optoelectronic device 102 may be electrically connected to a conducting pad 104 formed on the surface 100a and the optoelectronic device 102 may be electrically connected to another conducting route through the conducting pad 104. In one embodiment, a microlens array 102a may be disposed on the optoelectronic device 102 to assist in the entering and/or emitting of light.

Although only a single-layered conducting pad 104 is shown in FIG. 1A, a plurality of conducting pads may be stacked and/or arranged on the substrate 100. For example, in one embodiment, the conducting pad 104 is a plurality of conducting pads stacked with each other, at least a conducting pad, or a conducting pad structure formed by at least a conducting pad and at least an interlayer connection structure. In the following embodiments, for convenience, a single-layered conducting pad 104 is shown in the drawings for simplicity.

As shown in FIG. 1A, in one embodiment, a conducting layer 110 electrically connected to the conducting pad 104 may be formed on the substrate 100. The conducting layer 110 may be used to electrically connect the optoelectronic device 102 (through, for example, the conducting pad 104). A conducting route between the conducting layer 110 and the conducting pad 104 may be, for example, a through substrate conducting structure or a redistribution layer extending on an external side of the substrate 100. In the embodiment shown in FIG. 1A, a through substrate conducting structure is illustrated as an example. In one embodiment, the substrate 100 includes a through-hole 106 therein, which extends from the surface 100b towards the surface 100a of the substrate 100. In one embodiment, the through-hole 106 exposes a portion of the conducting pad 104. In addition, the conducting layer 110 extends onto a sidewall of the through-hole 106 and the surface 100b of the substrate 100 and is electrically connected to the conducting pad 104. A material of the conducting layer 110 may be, for example, (but is not limited to) a metal material such as copper, aluminum, gold, or combinations thereof.

It should be appreciated that if the material of the substrate 100 (such as silicon) is electrically conductive, an insulating layer needs to be formed between the conducting layer 110 and the substrate 100 to prevent short-circuiting. For example, in the embodiment shown in FIG. 1A, an insulating layer 108 may be optionally formed between the substrate 100 and the conducting layer 110. Similarly, according to the situation, an insulating layer may also be formed between another conducting structure and the substrate 100.

In one embodiment, the through-hole 106 preferably has an "inverted angle structure". That is, a width of the through-hole 106 increases along a direction from the surface 100b towards the surface 100a. The etching condition may be adjusted such that the formed through-hole 106 has characteristics of being an "inverted angle structure". The position of the through-hole 106 is preferably located directly on the conducting pad 104 such that at least a portion of the conducting pad 104 is exposed at a bottom of the through-hole 106. In some embodiments, an interlayer dielectric layer may be formed on the conducting pad 104. In this case, another etching process may be performed to remove the interlayer dielectric layer such that the conducting pad 104 is exposed at the bottom of the through-hole 106.

Next, the insulating layer 108 may be formed on the sidewall and the bottom of the through-hole 106 by, for example, chemical vapor deposition or another application method. The insulating layer 108 may further extend onto the surface 100b of the substrate 100. Then, the insulating layer 108 on the bottom of the through-hole 106 is removed such that the conducting pad 104 is exposed. Because the through-hole 106 has the "inverted angle structure" in one embodiment, the insulating layer 108 on the bottom of the through-hole 108 may be etched and removed by a self-aligning process. No additional patterned mask layer needs to be formed. Fabrication cost and time may be reduced.

Next, the conducting layer 110 is formed on the insulating layer 108 in the through-hole 106. The conducting layer 110 electrically contacts with the conducting pad 104 and thus is electrically connected to the optoelectronic device 102. The conducting layer 110 may also further extend onto the surface 100b of the substrate 100. In one embodiment, a seed layer (not shown) may be formed on the sidewall and the bottom of the through-hole 106 and the surface 100b by, for example, physical vapor deposition. Then, a patterned mask layer (not shown) is formed on the seed layer. The patterned mask layer has a plurality of openings. The openings expose regions where the conducting layer 110 is intended to be formed. Then, a conducting material may be electroplated on the seed layer exposed by the opening by an electroplating process. The patterned mask layer is then removed and an etching process is applied to the seed layer thereunder. Through the method mentioned above, the conducting layer 110 having desired conducting patterns may be formed on the surface 100b of the substrate 100 according to requirements. The conducting layer 110 may also be called a redistribution layer.

As shown in FIG. 1A, after the conducting layer 110 is formed, a protection layer 112 is formed on the surface 100b and the conducting layer 110. The protection layer 112 includes, for example, (but is not limited to) a solder mask material, polyimide, or green paint. At least an opening 113 is defined in the protection layer 112, which exposes a portion of the conducting layer 110.

Next, as shown in FIG. 1B, a light shielding layer 114 is formed on the protection layer 112. A material of the light shielding layer 114 may be, for example, a polymer material. In one embodiment, the light shielding layer 114 may be a photoresist layer for the convenience of being patterned. For example, the light shielding layer 114 may be a black photoresist layer. In one embodiment, the light shielding layer 114 is a negative type photoresist layer. In one embodiment, the light shielding layer 114 may be formed on the substrate 100 by, for example, application, and then be patterned as, for example, that shown in FIG. 1B.

As shown in FIG. 1B, in one embodiment, the light shielding layer 114 may include a first light shielding layer and a second light shielding layer which are a backside light shielding layer 114a located on the protection layer 112 and a sidewall light shielding layer 114b located on the sidewall of the protection layer 112. In one embodiment, the backside light shielding layer 114a further extends to the sidewall light shielding layer 114b and contacts therewith.

The light shielding layer 114 may cover the optoelectronic device 102 to assist in blocking and/or absorbing light coming from the outside of the chip package, especially light coming from behind the surface 100b of the substrate 100, thus facilitating operation of the optoelectronic device 102. For example, if the optoelectronic device 102 is an image sensor device, the light shielding layer 114 may block light coming from the surface 100b of the substrate 100 to prevent image noise from occurring. Alternatively, if the optoelectronic device 102 is a light emitting device, the light shielding layer 114 may block and/or absorb light coming from the surface 100b of the substrate 100 to prevent the wavelength and/or the intensity of light emitted by the chip package from being affected by external light.

In one embodiment, the sidewall light shielding layer 114b extending on the sidewall of the opening 113 of the protection layer 112 may further extend from the sidewall of the opening 113 onto the bottom of the opening 113 and cover the conducting layer 110 thereunder, as shown in the embodiment in FIG. 1B. In one embodiment, the sidewall light shielding layer 114b may directly contact with the conducting layer 110. For example, the sidewall light shielding layer 114b extending on the bottom of the opening 113 may directly contact with the conducting layer 110. As shown in the embodiment in FIG. 1B, the sidewall light shielding layer 114b may have a smaller opening at the bottom of the opening 113, which has a width W1. The opening of the sidewall light shielding layer 114b may be used to define the position of a conducting bump which is subsequently formed.

Next, as shown in FIG. 1C, a conducting bump 116 is disposed on the surface 100b of the substrate 100, which is filled in the opening 113 of the protection layer 112 to electrically contact with the conducting layer 110. That is, the conducting bump 116 may be disposed on the portion of the conducting layer 110 which is not covered by the light shielding layer 114 in the opening 113. The conducting bump 116 is, for example, a solder ball. An under bump metallurgy layer may be formed between the conducting bump 116 and the conducting layer 110. The conducting bump 116 may be disposed by, for example, screen printing.

As shown in FIG. 1C, in one embodiment, the backside light shielding layer 114a extends to the sidewall light shielding layer 114b, and the sidewall light shielding layer 114b may cover a portion of the bottom of the opening 113. Thus, a bottom of the sidewall light shielding layer 114b may be substantially coplanar with a bottom of the conducting bump 116. In addition, in one embodiment, a minimum distance between the light shielding layer 114 and the conducting bump 116 is smaller than a minimum distance between the protection layer 112 and the conducting bump 116. For example, in the embodiment shown in FIG. 1C, the light shielding layer 114 and the conducting bump 116 directly contact with each other (i.e., the sidewall light shielding layer 114b of the light shielding layer 114 directly contacts with the conducting bump 116), wherein the minimum distance therebetween is zero, which is smaller than the minimum distance between the protection layer 112 and the conducting bump 116. However, it should be appreciated that the embodiments of the present invention are not limited thereto. In another embodiment, the light shielding layer 114 does not directly contact with the conducting bump 116 and is separated from the conducting bump 116 by a distance (not shown).

In one embodiment, the process condition may be adjusted such that the conducting bump has a width W2 larger than the width W1 of the opening of the light shielding layer 114. Thus, in this case, a projection of the conducting bump 116 on the bottom of the opening 113 overlaps a projection of the light shielding layer 114 on the bottom of the opening 113. Therefore, it may be ensured that external light may be substantially and completely blocked and/or absorbed by the light shielding layer 114 and the conducting bump 116 such that the operation of the chip package 102 is not affected. In addition, in one embodiment, the protection layer does not contact with the conducting bump 116.

Figure 2A:
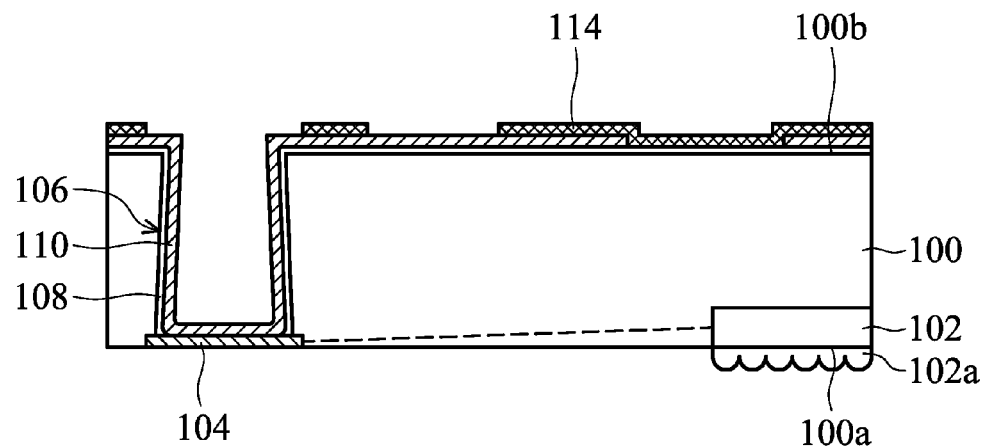
FIGS. 2A-2C are cross-sectional views showing the steps of forming a chip package according to an embodiment of the present invention.
Figure 2B:
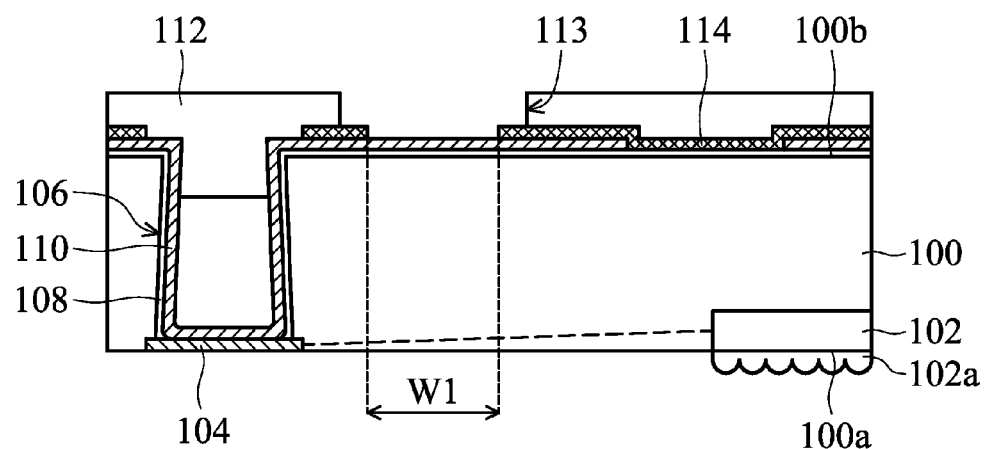
Figure 2C:
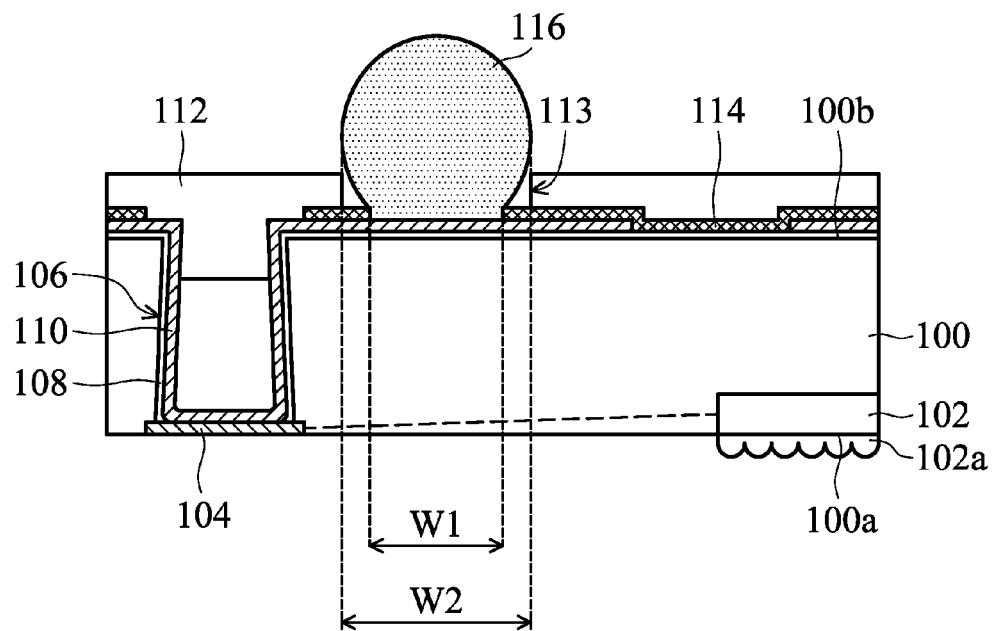

In the above embodiments, the protection layer 112 is located between the light shielding layer 114 and the substrate 100. However, embodiments of the invention are not limited thereto. In another embodiment, the light shielding layer 114 may be located between the protection layer 112 and the substrate 100. FIGS. 2A-2C are cross-sectional views showing the steps of forming a chip package according to another embodiment of the present invention, wherein same or similar reference numbers are used to designate same or similar elements.

As shown in FIG. 2A, a through substrate conducting structure may be optionally formed in a substrate 100 with an optoelectronic device 102 formed therein by a method similar to that illustrated in the embodiment shown in FIG. 1A. The main difference between the embodiments shown in FIGS. 2A and 1A is that the light shielding layer 114 is formed on the surface 100b of the substrate 100 before the protection layer 112 is formed.

As shown in FIG. 2A, by using similar materials and processes, a patterned light shielding layer 114 may be formed on a conducting layer 110 on the substrate 100. In one embodiment, the light shielding layer may be conformally formed on the conducting layer 110 to directly contact with the conducting layer 110.

Next, as shown in FIG. 2B, a protection layer 112 is formed on the surface 100b of the substrate 100. The protection layer 112 has an opening 113 which exposes a portion of the light shielding layer 114 and a portion of the conducting layer 110. In one embodiment, a width of the opening 113 of the protection layer 112 is larger than a width W1 of an opening of the light shielding layer 114 extending on a bottom of the opening 113.

As shown in FIG. 2C, a conducting bump 116 is filled into the opening 113 of the protection layer 112. Similarly, a width W2 of the conducting bump 116 is larger than the width W1 of the opening of the light shielding layer 114. That is, in this case, a projection of the conducting bump 116 on the bottom of the opening 113 overlaps with a projection of the light shielding layer 114 on the bottom of the opening 113. Therefore, it may be ensured that external light may be substantially and completely blocked and/or absorbed by the light shielding layer 114 and the conducting bump 116 such that the operation of the chip package 102 is not affected.

In the chip package of embodiments of the invention, the light shielding layer is used to block and/or absorb external light such that operation of the chip package is better. The light shielding layer in the chip package of the embodiments of the present invention further extends into the opening of the protection layer. Thus, the light shielding layer and the conducting bump in the opening of the protection layer may together block and/or absorb external light, and the light sensing precision or light emitting precision of the optoelectronic device may be improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a substrate having a first surface and a second surface;
   an optoelectronic device disposed at the first surface;
   a protection layer located on the second surface of the substrate, wherein the protection layer has an opening;
   a light shielding layer located on the second surface of the substrate, wherein a portion of the light shielding layer extends into the opening of the protection layer, wherein the light shielding layer is an insulating material;
   a conducting bump disposed on the second surface of the substrate and filled in the opening of the protection layer, wherein the conducting bump is in direct contact with the light shielding layer that extends into the opening; and
   a conducting layer located between the substrate and the protection layer, wherein the conducting layer electrically connects the optoelectronic device to the conducting bump.

2. The chip package as claimed in claim 1, wherein the light shielding layer comprises a first light shielding layer and a second light shielding layer, wherein the first light shielding layer is located on the protection layer, and the second light shielding layer is located on a sidewall of the opening of the protection layer.

3. The chip package as claimed in claim 2, wherein the first light shielding layer extends to the second light shielding layer.

4. The chip package as claimed in claim 3, wherein the second light shielding layer further extends onto a bottom of the opening.

5. The chip package as claimed in claim 4, wherein the opening exposes a portion of the conducting layer, and the second light shielding layer covers a portion of the conducting layer.

6. The chip package as claimed in claim 5, wherein the conducting bump is disposed on a portion of the conducting layer which is not covered by the second light shielding layer in the opening.

7. The chip package as claimed in claim 1, wherein the light shielding layer extends onto a bottom of the opening.

8. The chip package as claimed in claim 1, wherein a projection of the conducting bump on a bottom of the opening overlaps a projection of the light shielding layer on the bottom of the opening.

9. The chip package as claimed in claim 1, wherein the light shielding layer is located between the protection layer and the substrate.

10. The chip package as claimed in claim 1, wherein the protection layer is located between the light shielding layer and the substrate.

11. The chip package as claimed in claim 1, wherein the protection layer does not contact with the conducting bump.

12. The chip package as claimed in claim 1, wherein the light shielding layer directly contacts with the conducting layer.

13. The chip package as claimed in claim 1, further comprising a through substrate conducting structure comprising:
   a through-hole extending from the second surface towards the first surface; and
   an insulating layer located on a sidewall of the through-hole and extending on the second surface of the substrate;
   wherein the conducting layer extends on the insulating layer in the through-hole.

14. The chip package as claimed in claim 13, wherein a width of the through-hole increases along a direction from the second surface towards the first surface.

15. The chip package as claimed in claim 13, wherein a bottom of the through-hole exposes a conducting pad, wherein the conducting pad is electrically connected to the optoelectronic device.

16. The chip package as claimed in claim 15, wherein the conducting layer electrically contacts with the conducting pad.

17. The chip package as claimed in claim 1, wherein the optoelectronic device comprises an image sensor device or a light emitting device.

18. The chip package as claimed in claim 1, wherein a bottom of the light shielding layer is substantially coplanar with a bottom of the conducting bump.

19. The chip package as claimed in claim 1, wherein a minimum distance between the light shielding layer and the conducting bump is smaller than a minimum distance between the protection layer and the conducting bump.

* * * * *